(12) United States Patent
Zhang et al.

(10) Patent No.: US 10,860,944 B2
(45) Date of Patent: Dec. 8, 2020

(54) PHASE SHIFTER, QUANTUM LOGIC GATE APPARATUS, OPTICAL QUANTUM COMPUTING APPARATUS, AND PHASE SHIFT METHOD

(71) Applicant: Huawei Technologies Co., Ltd., Shenzhen (CN)

(72) Inventors: Wen Zhang, Shenzhen (CN); Chen-Xiong Zhang, Plano, TX (US)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 161 days.

(21) Appl. No.: 16/234,083

(22) Filed: Dec. 27, 2018

(65) Prior Publication Data

US 2019/0156235 A1 May 23, 2019

Related U.S. Application Data

(63) Continuation of application No. PCT/CN2016/087343, filed on Jun. 27, 2016.

(51) Int. Cl.
*G06N 10/00* (2019.01)
*G02F 1/01* (2006.01)
(Continued)

(52) U.S. Cl.
CPC ............ *G06N 10/00* (2019.01); *G02F 1/01* (2013.01); *G02F 3/00* (2013.01); *G02F 3/026* (2013.01); *H01S 5/10* (2013.01); *B82Y 10/00* (2013.01)

(58) Field of Classification Search
None
See application file for complete search history.

(56) References Cited

U.S. PATENT DOCUMENTS

| 7,560,726 B2 | 7/2009 | Beausoleil et al. |
| 2004/0156407 A1 | 8/2004 | Beausoleil et al. |

(Continued)

FOREIGN PATENT DOCUMENTS

| CN | 1440097 A | 9/2003 |
| CN | 1442932 A | 9/2003 |

(Continued)

OTHER PUBLICATIONS

Machine Translation and Abstract of Chinese Publication No. CN102522963, Jun. 27, 2012, 9 pages.

(Continued)

*Primary Examiner* — Jennifer D. Carruth
(74) *Attorney, Agent, or Firm* — Conley Rose, P.C.

(57) ABSTRACT

A phase shifter, a quantum logic gate apparatus, an optical quantum computing apparatus, and a phase shift method, where the phase shifter includes an optical resonant cavity and a quantum point, where a resonance frequency of the optical resonant cavity is $\omega_c$, the quantum point is located in the optical resonant cavity, and a transition frequency of the quantum point is $\omega_x$, the quantum point and the optical resonant cavity are coupled to form a coupled system, and a transition energy difference of the coupled system is determined by $\omega_c$, $\omega_x$, and a coupling strength between the quantum point and the optical resonant cavity (g), and $\omega_x$ is set.

20 Claims, 4 Drawing Sheets

(51) Int. Cl.
  *H01S 5/10*   (2006.01)
  *G02F 3/00*   (2006.01)
  *G02F 3/02*   (2006.01)
  *B82Y 10/00*  (2011.01)

(56) References Cited

U.S. PATENT DOCUMENTS

| | | | |
|---|---|---|---|
| 2009/0206871 | A1 | 8/2009 | Baumgardner et al. |
| 2013/0048845 | A1* | 2/2013 | Senellart ............... G02F 1/3526 250/251 |
| 2013/0270596 | A1* | 10/2013 | Senellart ............... H01L 33/465 257/98 |
| 2014/0055845 | A1 | 2/2014 | Jain |
| 2015/0333840 | A1* | 11/2015 | Bennett .................. H01S 5/041 398/65 |
| 2018/0032895 | A1* | 2/2018 | Jiang ...................... G06N 10/00 |
| 2019/0384576 | A1* | 12/2019 | Scarlett ................. G06N 10/00 |

FOREIGN PATENT DOCUMENTS

| | | |
|---|---|---|
| CN | 102522963 A | 6/2012 |
| CN | 103620894 A | 3/2014 |
| CN | 105404073 A | 3/2016 |
| JP | H10322329 A | 12/1998 |

OTHER PUBLICATIONS

Machine Translation and Abstract of Japanese Publication No. JPH10322329, Dec. 4, 1998, 17 pages.
Strauch, F., "Quantum logic gates for superconducting resonator qudits," arXiv:1108.2984v2 [quant-ph], Oct. 26, 2011, 10 pages.
Sleator, T., et al, "Realizable Universal Quantum Logic Gates," Physical Review Letters, vol. 74, No. 20, May 15, 1995, 4 pages.
Foreign Communication From a Counterpart Application, Chinese Application No. 201680087196.X, Chinese Office Action dated Dec. 19, 2019, 3 pages.
Foreign Communication From a Counterpart Application, Chinese Application No. 201680087196.X, Chinese Search Report dated Dec. 6, 2019, 2 pages.
Machine Translation and Abstract of Chinese Publication No. CN1440097, Sep. 3, 2003, 5 pages.
Machine Translation and Abstract of Chinese Publication No. CN1442932, Sep. 17, 2003, 10 pages.
Machine Translation and Abstract of Chinese Publication No. CN105404073, Mar. 16, 2016, 20 pages.
Foreign Communication From a Counterpart Application, PCT Application No. PCT/CN2016/087343, English Translation of International Search Report dated Mar. 29, 2017, 2 pages.
Foreign Communication From a Counterpart Application, PCT Application No. PCT/CN2016/087343, English Translation of Written Opinion dated Mar. 29, 2017, 4 pages.

* cited by examiner

PHASE SHIFTER, QUANTUM LOGIC GATE APPARATUS, OPTICAL QUANTUM COMPUTING APPARATUS, AND PHASE SHIFT METHOD

CROSS-REFERENCE TO RELATED APPLICATIONS

This application is a continuation of International Patent Application No. PCT/CN2016/087343 filed on Jun. 27, 2016, which is hereby incorporated by reference in its entirety.

TECHNICAL FIELD

Embodiments of the present disclosure relate to the quantum computing field, and in particular, to a phase shifter, a quantum logic gate apparatus, an optical quantum computing apparatus, and a phase shift method.

BACKGROUND

A quantum computer is a device that performs general computing according to principles of quantum mechanics. A classical computer encodes, stores, and processes data using 0 and 1 in binary representation, and a value of each bit is 0 or 1. However, quantum computing is based on qubit (QB) control, and each qubit may be in a superposition state of quantum states, a $|0\rangle_{qb}$ state and a $|1\rangle_{qb}$ state. Therefore, the quantum computer has a strong quantum parallel computing capability.

In optical quantum computing and quantum information processing, a single photon is used as a qubit carrier. Using the single photon as the qubit carrier has the following several advantages. First, a noise level of a single-photon system is relatively low, second, a single-photon bit logic gate is relatively easily implemented using the single-photon system, third, there are diverse coding schemes.

However, in order to implement a multi-qubit logic gate in an optical quantum computing apparatus, an optical nonlinearity requirement for materials needs to be satisfied. A dual-qubit controlled NOT gate (CNOT) is used as an example. When a control bit is $|0\rangle_{qb}$, no operation is performed on a target bit. When a control bit is $|1\rangle_{qb}$, phase inversion may be performed on a target bit such that a phase of the target bit shifts by π. Existing nonlinear optical materials cannot satisfy a requirement of extremely strong optical nonlinearity required in such phase inversion implemented through interaction between single photons.

SUMMARY

Embodiments of the present disclosure provide a phase shifter, a quantum logic gate apparatus, an optical quantum computing apparatus, and a phase shift method in order to implement quantum-state phase inversion.

According to a first aspect, a phase shifter is provided, including an optical resonant cavity, where a resonance frequency of the optical resonant cavity is $\omega_c$, and a quantum point, where the quantum point is located in the optical resonant cavity, and a transition frequency of the quantum point is $\omega_x$, where the quantum point and the optical resonant cavity are coupled to form a coupled system, a transition energy difference of the coupled system is determined by $\omega_c$, $\omega_x$, and a coupling strength g between the quantum point and the optical resonant cavity, and $\omega_x$ is set such that the transition energy difference of the coupled system is the same as energy of at least one photon that is input into the coupled system.

In this embodiment of the present disclosure, the coupled system formed by coupling the quantum point and the optical resonant cavity is used in the phase shifter to adjust the transition frequency of the quantum point such that the transition energy difference of the coupled system is the same as energy of one photon or two photons input into the coupled system, thereby implementing phase inversion in a single-photon state or a dual-photon state correspondingly.

It should be understood that, in this embodiment of the present disclosure, photon energy is determined by a photon frequency. To be specific, there is the following relationship between photon energy E and a photon angular frequency ω E=ℏω, where ℏ is a reduced Planck constant, and ω is the photon angular frequency. Similarly, there is also only a ℏ multiple relationship between energy level energy and an energy level frequency, and between transition energy and a transition frequency. All frequencies mentioned in this embodiment of the present disclosure may be angular frequencies ω, or maybe line frequencies v. There is the following relationship between an angular frequency and a line frequency, ω=2πv. According to an expression custom, an angular frequency may be used to represent energy.

With reference to the first aspect, in an implementation of the first aspect, the phase shifter further includes an adjustment apparatus, and the adjustment apparatus is configured to adjust $\omega_x$.

The phase shifter in this embodiment of the present disclosure may adjust the transition frequency of the quantum point such that the transition energy difference of the coupled system satisfies single-photon resonance or dual-photon resonance when a frequency of an input photon is a specific value, thereby implementing inversion in a single-photon state or a dual-photon state. That is, a work state of the phase shifter in this embodiment of the present disclosure may be configured, in a timely manner, as a single-photon phase shift work state, a dual-photon phase shift work state, or a phase shift-free work state such that quantum-state phase inversion is more flexible.

In this embodiment of the present disclosure, the transition frequency of the quantum point is adjusted such that the transition energy difference of the coupled system is the same as the energy of the at least one photon that is input into the coupled system. In this way, there is a function relationship between an adjusted transition frequency of the quantum point and he following three parameters, a photon frequency, the resonance frequency of the optical resonant cavity, and the coupling strength between the optical resonant cavity.

With reference to the first aspect and the foregoing implementation of the first aspect, in another implementation of the first aspect, the adjustment apparatus is a heater, and the heater is configured to adjust $\omega_x$ by changing temperature of the quantum point.

With reference to any one of the first aspect or the foregoing implementations of the first aspect, in another implementation of the first aspect, $\omega_x$ is set such that a transition energy difference for transition of the coupled system from a ground state to a first-order dressed state is the same as energy of one photon that is input into the coupled system.

With reference to any one of the first aspect or the foregoing implementations of the first aspect, in another implementation of the first aspect, $\omega_x$ is set such that a transition energy difference for transition of the coupled system from a ground state to a second-order dressed state is the same as energy of two photons that are input into the coupled system.

With reference to any one of the first aspect or the foregoing implementations of the first aspect, in another implementation of the first aspect, a transition energy level of the coupled system includes two first-order dressed states $|1-\rangle$ and $|1+\rangle$, and frequencies of $|1-\rangle$ and $|1+\rangle$ are respectively $$\omega_c + \frac{1}{2}\Delta - \frac{1}{2}\sqrt{\Delta^2 + 4g^2} \text{ and } \omega_c + \frac{1}{2}\Delta + \frac{1}{2}\sqrt{\Delta^2 + 4g^2},$$

where $\Delta=\omega_x-\omega_c$, and the transition energy difference of the coupled system is determined by the frequency of $|1-\rangle$ or $|1+\rangle$.

With reference to any one of the first aspect or the foregoing implementations of the first aspect, in another implementation of the first aspect, a transition energy level of the coupled system includes two second-order dressed states $|2-\rangle$ and $|2+\rangle$, and frequencies of $|2-\rangle$ and $|2+\rangle$ are respectively $$2\omega_c + \frac{1}{2}\Delta - \frac{1}{2}\sqrt{\Delta^2 + 8g^2} \text{ and } 2\omega_c + \frac{1}{2}\Delta + \frac{1}{2}\sqrt{\Delta^2 + 8g^2},$$

where $\Delta=\omega_x-\omega_c$, and the transition energy difference of the coupled system is determined by the frequency of $|2-\rangle$ or $|2+\rangle$.

The coupled system includes the two first-order dressed states $|1-\rangle$ and $|1+\rangle$, and the two second-order dressed states $|2-\rangle$ and $|2+\rangle$. The coupled system may further have another higher-order dressed state for implementing multi-photon resonance. However, the coupled system usually chooses to perform easier-to-implement transition between a lower-order dressed state and the ground state, to implement dual-photon resonance or single-photon resonance. For example, when frequencies of four photons that are input into the coupled system are equal to a frequency difference between a fourth-order dressed state and the ground state, resonance of the four photons can be implemented. However, transition of the coupled system between the ground state and the fourth-order dressed state seldom occurs. The coupled system is more likely to choose to perform transition between the ground state and a lower-order dressed state. In this embodiment of the present disclosure, transition of the coupled system between the ground state and the first-order dressed state and between the ground state and the second-order dressed state is used as an example for description, and no other higher-order dressed state energy level is considered.

With reference to any one of the first aspect or the foregoing implementations of the first aspect, in another implementation of the first aspect, the optical resonant cavity is any one of a photonic crystal micro-cavity, a microdisk resonant cavity, a microring resonant cavity, a microcolumn resonant cavity, or a Fabry-Perot cavity.

The phase shifter in this embodiment of the present disclosure does not need to use a laser pump to input additional pump light to excite atomic transition. This facilitates integration, and can reduce energy consumption.

In an implementation solution in other approaches, a target bit photon and a control bit photon that have different frequencies are used, and the target bit photon and the control bit photon are input into a four-level system. When a control bit is in different quantum states, phase inversion of a target bit is implemented. Frequencies of photons that are input into the phase shifter in this embodiment of the present disclosure may be the same. This can reduce system complexity and facilitate integration.

According to a second aspect, a quantum logic gate apparatus is provided, where the quantum logic gate apparatus includes a first optical splitter, a second optical splitter, and two first phase shifters according to the first aspect, and the two first phase shifters according to the first aspect are connected between the first optical splitter and the second optical splitter using a waveguide.

In this embodiment of the present disclosure, an optical splitter may be added to form different quantum logic gate apparatuses together with the phase shifter provided according to the first aspect in order to implement different quantum logic gate functions. In addition, the phase shifter in the quantum logic gate apparatus in this embodiment of the present disclosure can configure, in a timely manner, phase inversion in different quantum states such that work states of different phase shifters in a same quantum logic gate apparatus can be changed by adjusting a transition frequency of a quantum point, thereby implementing different quantum logic gate functions. Herein, the work state of the phase shifter may be a single-photon phase shift work state, a dual-photon phase shift work state, or a phase shift-free work state.

With reference to the second aspect, in an implementation of the second aspect, a transition frequency of a quantum point in the first phase shifter is set such that a transition energy difference for transition of a coupled system in the first phase shifter from a ground state to a second-order dressed state is the same as energy of two photons that are input into the coupled system, and the quantum logic gate apparatus is a controlled-Z gate apparatus.

With reference to the second aspect and the foregoing implementation of the second aspect, in another implementation of the second aspect, the quantum logic gate apparatus further includes a third optical splitter, a fourth optical splitter, a fifth optical splitter, a sixth optical splitter, and two second phase shifters according to any one of the first aspect or the implementations of the first aspect, where the two second phase shifters according to any one of the first aspect or the implementations of the first aspect are connected between the third optical splitter and the fourth optical splitter using a waveguide, two first output ends of the fifth optical splitter are respectively connected to a first input end of the first optical splitter and a second input end of the third optical splitter using waveguides, and two third input ends of the sixth optical splitter are respectively connected to a second output end of the second optical splitter and a third output end of the fourth optical splitter using waveguides.

With reference to the second aspect and the foregoing implementation of the second aspect, in another implementation of the second aspect, a transition frequency of a quantum point in the second phase shifter is set such that a transition energy difference for transition of a coupled system in the second phase shifter from a ground state to a second-order dressed state is the same as energy of two photons that are input into the coupled system, a transition frequency of a quantum point in the first phase shifter is set such that the transition energy difference of the coupled system is different from energy of at least one photon that is input into the coupled system, and the quantum logic gate apparatus is a controlled-Z gate apparatus.

With reference to the second aspect and the foregoing implementation of the second aspect, in another implementation of the second aspect, a transition frequency of a quantum point in the first phase shifter and a transition frequency of a quantum point in the second phase shifter are both set such that a transition energy difference for transition of a coupled system in a corresponding phase shifter from a ground state to a first-order dressed state is the same as energy of one photon that is input into the coupled system, and the quantum logic gate apparatus is a swap gate apparatus.

According to a third aspect, an optical quantum computing apparatus is provided, including at least one quantum logic gate apparatus according to the second aspect.

The quantum logic gate apparatus and the optical quantum computing apparatus in the embodiments of the present disclosure use a strong-nonlinearity system in which single photons interact, and can implement a function of a multi-qubit logic gate. Compared with an implementation in which a linear optical quantum computing method is used, there is no nonlinearity requirement, and a logic-gate function with a specific probability is performed, the implementation in the embodiments of the present disclosure can improve multi-qubit quantum computing efficiency and performance.

According to a fourth aspect, a phase shift method is provided, where the method can be applied to a coupled system that is formed by coupling an optical resonant cavity and a quantum point, the quantum point is located in the optical resonant cavity, and the method includes obtaining a resonance frequency $\omega_c$ of the optical resonant cavity, a transition frequency $\omega_x$ of the quantum point, and a coupling strength g of coupling between the quantum point and the optical resonant cavity, determining a transition energy difference of the coupled system based on $\omega_c$, $\omega_x$, and g, and adjusting $\omega_x$ such that the transition energy difference of the coupled system is the same as energy of at least one photon that is input into the coupled system.

With reference to the fourth aspect, in an implementation of the fourth aspect, the adjusting $\omega_x$ such that the transition energy difference of the coupled system is the same as energy of at least one photon that is input into the coupled system includes adjusting $\omega_x$ such that an energy difference for transition of the coupled system from a ground state to a first-order dressed state is the same as energy of one photon that is input into the coupled system.

With reference to the fourth aspect and the foregoing implementation of the fourth aspect, in another implementation of the fourth aspect, the adjusting $\omega_x$ such that the transition energy difference of the coupled system is the same as energy of at least one photon that is input into the coupled system includes adjusting $\omega_x$ such that an energy difference for transition of the coupled system from a ground state to a second-order dressed state is the same as energy of two photons that are input into the coupled system.

With reference to any one of the fourth aspect or the foregoing implementations of the fourth aspect, in another implementation of the fourth aspect, a transition energy level of the coupled system includes two first-order dressed states $|1-\rangle$ and $|1+\rangle$, and frequencies of $|1-\rangle$ and $|1+\rangle$ are respectively $$\omega_c + \frac{1}{2}\Delta - \frac{1}{2}\sqrt{\Delta^2 + 4g^2} \text{ and } \omega_c + \frac{1}{2}\Delta + \frac{1}{2}\sqrt{\Delta^2 + 4g^2},$$

where $\Delta=\omega_x-\omega_c$, and the transition energy difference of the coupled system is determined by the frequency of $|1-\rangle$ or $|1+\rangle$.

With reference to any one of the fourth aspect or the foregoing implementations of the fourth aspect, in another implementation of the fourth aspect, a transition energy level of the coupled system includes two second-order dressed states $|2-\rangle$ and $|2+\rangle$, and frequencies of $|2-\rangle$ and $|2+\rangle$ are respectively $$2\omega_c + \frac{1}{2}\Delta - \frac{1}{2}\sqrt{\Delta^2 + 8g^2} \text{ and } 2\omega_c + \frac{1}{2}\Delta + \frac{1}{2}\sqrt{\Delta^2 + 8g^2},$$

where the transition energy difference of the coupled system is determined by the frequency of $|2+\rangle$ or $|2-\rangle$.

For specific implementation steps of the phase shift method in this embodiment according to the fourth aspect of the present disclosure, refer to specific functions of the phase shifter according to the foregoing first aspect. To avoid repetition, details are not described herein again.

BRIEF DESCRIPTION OF DRAWINGS

To describe the technical solutions in some of the embodiments of the present disclosure more clearly, the following briefly describes the accompanying drawings describing some of the embodiments of the present disclosure. The accompanying drawings in the following description show merely some embodiments of the present disclosure, and a person of ordinary skill in the art may still derive other drawings from these accompanying drawings without creative efforts.

DESCRIPTION OF EMBODIMENTS

The following clearly describes the technical solutions in the embodiments of the present disclosure with reference to the accompanying drawings in the embodiments of the present disclosure. The described embodiments are a part rather than all of the embodiments of the present disclosure. All other embodiments obtained by a person of ordinary skill in the art based on the embodiments of the present disclosure without creative efforts shall fall within the protection scope of the present disclosure.

Figure 1:
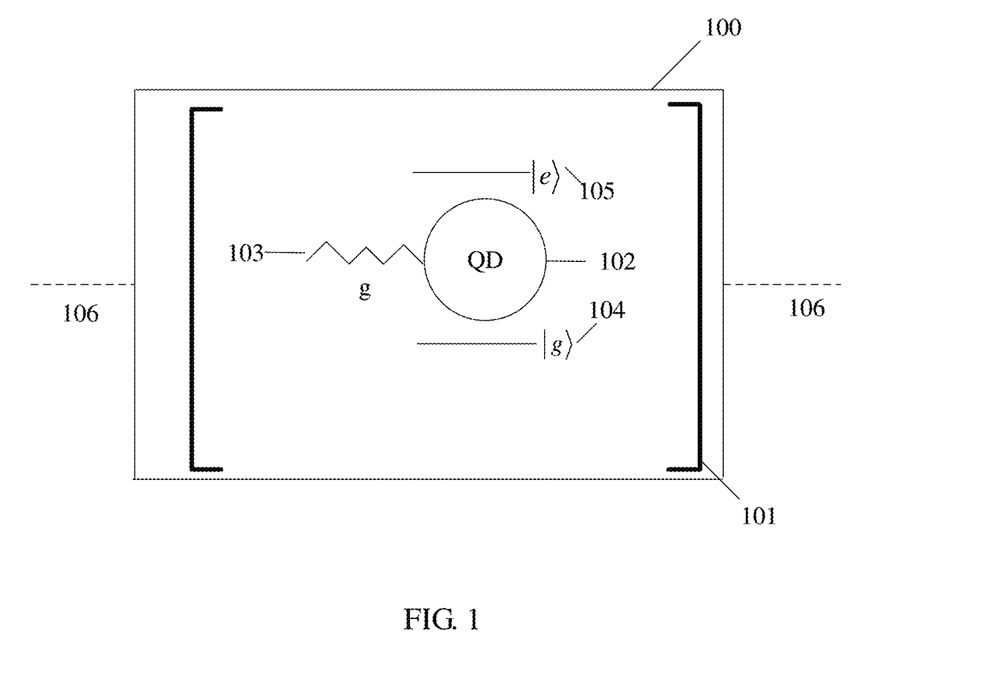
FIG. 1 is a schematic diagram of a phase shifter according to an embodiment of the present disclosure.

FIG. 1 is a schematic diagram of a phase shifter according to an embodiment of the present disclosure. The phase shifter 100 in FIG. 1 includes an optical resonant cavity 101 and a quantum point 102. In FIG. 1, the optical resonant cavity 101 is represented by [ ]. The quantum point 102 is located in the optical resonant cavity 101 and designated as QD. A resonance frequency of the optical resonant cavity is $\omega_c$. A transition frequency of the quantum point is $\omega_x$. The quantum point and the optical resonant cavity are coupled to form a coupled system. A transition energy difference of the coupled system is determined by $\omega_c$, $\omega_x$, and a coupling strength g between the quantum point and the optical resonant cavity. $\omega_x$ is set such that the transition energy difference of the coupled system is the same as energy of at least one photon that is input into the coupled system.

According to the phase shifter in this embodiment of the present disclosure, the optical resonant cavity and the quantum point are coupled to form the coupled system and obtain the transition energy difference between different energy levels of the coupled system, the transition frequency of the quantum point is adjusted, and the photon is input into the coupled system such that the transition energy difference of the coupled system is the same as energy of one photon or two photons input into the coupled system. In this way, a single-photon state or dual-photon state phase of a photon that passes through the coupled system can be correspondingly changed to implement phase inversion.

In this embodiment of the present disclosure, the coupling strength between the optical resonant cavity and the quantum point is g, for example, as shown by 103 in FIG. 1.

The quantum point in this embodiment of the present disclosure may be referred to as a two-level quantum point. The two-level quantum point may be understood as a quantum point including at least two energy levels, a ground state $|g\rangle$ 104 and an excited state $|e\rangle$ 105. The transition frequency of the quantum point is a frequency difference between the ground state and the excited state, that is, $\omega_x$. Coupling between the quantum point and the optical resonant cavity may be implemented through energy conversion between the quantum point and the optical resonant cavity.

In FIG. 1, 106 is a waveguide. The phase shifter may be connected to another device using the waveguide, for example, may be connected to an optical splitter using the waveguide. The optical splitter in this embodiment of the present disclosure may also be referred to as a coupler.

In an embodiment of the present disclosure, the phase shifter may further include an adjustment apparatus configured to adjust the transition frequency $\omega_x$ of the quantum point.

Optionally, the adjustment apparatus in this embodiment of the present disclosure may be a heater. The adjustment apparatus heats the quantum point to change temperature of the quantum point in order to adjust the transition frequency of the quantum point. In this embodiment of the present disclosure, the transition frequency of the quantum point may alternatively be changed in another manner. Herein, descriptions are provided using an example in which the transition frequency of the quantum point is changed using the heater. However, this embodiment of the present disclosure is not limited thereto.

In an embodiment of the present disclosure, the coupling strength is interaction strength between the quantum point and the optical resonant cavity. The coupling strength may be determined by an electric dipole moment magnitude μ of the quantum point, a mode volume $V_m$ of the resonant cavity, and the resonance frequency $\omega_C$. For example, when the quantum point is located at a location with largest light field strength in the resonant cavity, the coupling strength is $$g = \frac{1}{\hbar}\sqrt{\frac{\hbar\omega_c}{2V_m}}\,\mu.$$

It is assumed that detuning of the coupled system formed by coupling the quantum point and the optical resonant cavity is $\Delta=\omega_x-\omega_c$, the coupled system is formed by coupling the two-level quantum point whose transition frequency is $\omega_x$ and the optical resonant cavity whose resonance frequency is $\omega_c$, and the energy levels of the coupled system include the ground state, two first-order dressed states $|1-\rangle$ and $|1+\rangle$, and two second-order dressed states $|2-\rangle$ and $|2+\rangle$. Diagonalization is performed using a Hamiltonian of the coupled system to obtain an energy eigenvalue, thereby obtaining frequencies of $|1-\rangle$, $|1+\rangle$, $|2-\rangle$, and $|2+\rangle$ as $$\omega_c + \frac{1}{2}\Delta - \frac{1}{2}\sqrt{\Delta^2 + 4g^2},$$

$$\omega_c + \frac{1}{2}\Delta + \frac{1}{2}\sqrt{\Delta^2 + 4g^2},$$

$$2\omega_c + \frac{1}{2}\Delta - \frac{1}{2}\sqrt{\Delta^2 + 8g^2}, \text{ and}$$

$$2\omega_c + \frac{1}{2}\Delta + \frac{1}{2}\sqrt{\Delta^2 + 8g^2}.$$

A frequency of the ground state is 0.

From the frequencies of the different energy levels of the coupled system, it can be learned that energy required by the coupled system to transit from the ground state to the first-order dressed state $|1+\rangle$ or $|1-\rangle$ is different from energy required by the coupled system to transit from the first-order dressed state to the second-order dressed state $|2+\rangle$ or $|2\rangle$. Therefore, the coupled system can selectively absorb a single photon or dual photons based on a photon frequency.

It is assumed that a quantum state that is input into the coupled system is $|\Psi\rangle = \alpha|0\rangle + \beta|1\rangle + \gamma|2\rangle$, where $|0\rangle$, $|1\rangle$, and $|2\rangle$ represent quantum states of zero photons, one photon, and two photons, respectively, α, β, γ are complex coefficient probability amplitudes of the quantum states $|0\rangle$, $|1\rangle$, and $|2\rangle$, respectively, and modular squares of α, β, γ are probabilities.

Figure 2A:
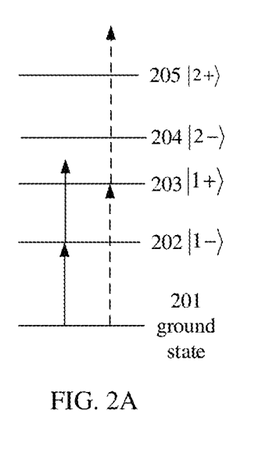
FIG. 2A, FIG. 2B, and FIG. 2C are structural diagrams of energy levels of a coupled system in different phase shift work states according to an embodiment of the present disclosure.

As shown in FIG. 2A, when a frequency of a single photon that is input into the coupled system is equal to a frequency at which the coupled system transits from the ground state to the first-order dressed state $|1+\rangle$ or $|1-\rangle$, in the coupled system, phase shift may be caused for an input single-photon state $|1\rangle$. In addition, because the coupled system cannot simultaneously absorb two photons to transit to the second-order dressed state, phase shift is not caused for a $|2\rangle$ state when two photons are simultaneously input. Such a work state of the phase shifter may be referred to as a single-photon phase shift work state. In this case, single-photon resonance is caused in the coupled system, a phase of the quantum state $|1\rangle$ of one photon is inverted, and a symbol of the quantum state $|1\rangle$ changes. That is, through the phase shifter, a quantum state that is output by the coupled system is $|\Psi\rangle = \alpha|0\rangle - \beta|1\rangle + \gamma|2\rangle$. In FIG. 2A, a solid line is used to indicate that a transition energy level difference for transition of the coupled system from the ground state to $|1-\rangle$ is the same as energy of one photon that is input into the coupled system, and that a transition energy level difference for transition of the coupled system from the ground state to $|2+\rangle$ or $|2-\rangle$ is different from energy of two photons that are input into the coupled system. In FIG. 2A, a dashed line is used to indicate that a transition energy level difference for transition of the coupled system from the ground state to $|1+\rangle$ is the same as energy of one photon that is input into the coupled system, and that a transition energy level difference for transition of the coupled system from the ground state to $|2+\rangle$ or $|2-\rangle$ is different from energy of two photons that are input into the coupled system.

Figure 2B:
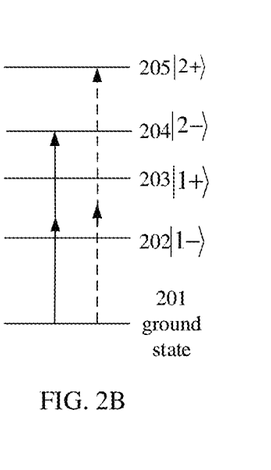

As shown in FIG. 2B, when a frequency of a photon that is input into the coupled system is equal to a half of a frequency at which the coupled system transits from the ground state to the second-order dressed state $|2+\rangle$ or $|2-\rangle$, in the coupled system, phase shift may be caused for an input dual-photon state $|2\rangle$. In addition, because the coupled system cannot absorb one photon to transit to the first-order dressed state, phase shift is not caused for a $|1\rangle$ state. Such a work state of the phase shifter may be referred to as a dual-photon phase shift work state. In this case, dual-photon resonance is caused in the coupled system, a phase of the quantum state $|2\rangle$ of two photons is inverted, and a symbol of the quantum state $|2\rangle$ changes. That is, through the phase shifter, a quantum state that is output by the coupled system is $|\Psi\rangle = \alpha|0\rangle + \beta|1\rangle - \gamma|2\rangle$. In FIG. 2B, a solid line is used to indicate that a transition energy level difference for transition of the coupled system from the ground state to $|2-\rangle$ is the same as energy of two photons that are input into the coupled system, and that a transition energy level difference for transition of the coupled system from the ground state to $|1+\rangle$ or $|1-\rangle$ is different from energy of one photon that is input into the coupled system. In FIG. 2B, a dashed line is used to indicate that a transition energy level difference for transition of the coupled system from the ground state to $|2+\rangle$ is the same as energy of two photons that are input into the coupled system, and that a transition energy level difference for transition of the coupled system from the ground state to $|1+\rangle$ or $|1-\rangle$ is different from energy of one photon that is input into the coupled system.

Figure 2C:
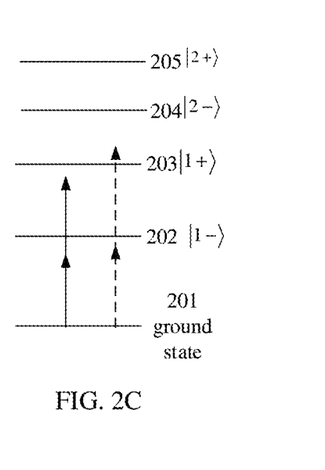

As shown in FIG. 2C, when a frequency of a photon that is input into the coupled system is neither equal to a half of a frequency at which the coupled system transits from the ground state to the second-order dressed state $|2+\rangle$ or $|2-\rangle$, nor equal to a frequency at which the coupled system transits from the ground state to the first-order dressed state $|1+\rangle$ or $|1-\rangle$, in the coupled system, phase shift is neither caused for $|2\rangle$ nor caused for $|1\rangle$. In this case, the coupled system does not resonate with the input photon. Such a work state of the phase shifter may be referred to as a phase shift-free work state. That is, through the phase shifter, a quantum state that is output by the coupled system is $|\Psi\rangle = \alpha|0\rangle + \beta|1\rangle + \gamma|2\rangle$.

In an embodiment of the present disclosure, the transition frequency of the quantum point may be adjusted such that a transition energy difference for transition of the coupled system from the ground state to the first-order dressed state is the same as energy of one photon that is input into the coupled system, thereby implementing single-photon resonance. A quantum state that is input into the coupled system is $|\Psi\rangle = \alpha|0\rangle + \beta|1\rangle + \gamma|2\rangle$, and a quantum state that is output by the coupled system is $|\Psi\rangle = \alpha|0\rangle - \beta|1\rangle + \gamma|2\rangle$.

In an embodiment of the present disclosure, the transition frequency of the quantum point may be adjusted such that a transition energy difference for transition of the coupled system from the ground state to the second-order dressed state is the same as energy of two photons that are input into the coupled system, thereby implementing dual-photon resonance. A quantum state that is output by the coupled system is $|\Psi\rangle = \alpha|0\rangle + \beta|1\rangle - \gamma|2\rangle$.

Further, in single-photon resonance, a frequency of a single photon that is input into the coupled system is $$\omega_0 = \omega_c + \frac{1}{2}\Delta - \frac{1}{2}\sqrt{\Delta^2 + 4g^2} \text{ or}$$

$$\omega_0 = \omega_c + \frac{1}{2}\Delta + \frac{1}{2}\sqrt{\Delta^2 + 4g^2}.$$

In dual-photon resonance, a sum of frequencies of two photons that are input into the coupled system is $$2\omega_0 = 2\omega_c + \frac{1}{2}\Delta - \frac{1}{2}\sqrt{\Delta^2 + 8g^2} \text{ or}$$

$$2\omega_0 = 2\omega_c + \frac{1}{2}\Delta + \frac{1}{2}\sqrt{\Delta^2 + 8g^2}.$$

That is, a frequency of a single photon that is input into the coupled system is $$\omega_0 = \omega_c + \frac{1}{4}\Delta - \frac{1}{4}\sqrt{\Delta^2 + 8g^2} \text{ or}$$

$$\omega_0 = \omega_c + \frac{1}{4}\Delta + \frac{1}{4}\sqrt{\Delta^2 + 8g^2}.$$

Detuning $\Delta = \omega_x - \omega_c$. The transition frequency of the quantum point for implementing single-photon resonance or dual-photon resonance can be obtained according to the foregoing formulas in order to adjust the transition frequency of the quantum point, thereby causing single-photon resonance or dual-photon resonance. In this way, phase shift of different quantum states is implemented.

Different logic gate apparatuses may be constituted using the phase shifter that works in the single-photon phase shift work state or the dual-photon phase shift work state. For example, the phase shifter may be used in combination with an optical splitter to constitute a controlled-Z gate, a CNOT gate, or the like.

The following describes the embodiments of the present disclosure in more detail with reference to specific examples. It should be noted that these examples are merely intended to help a person skilled in the art better understand the embodiments of the present disclosure, but are not intended to limit the scope of the embodiments of the present disclosure.

Figure 3:
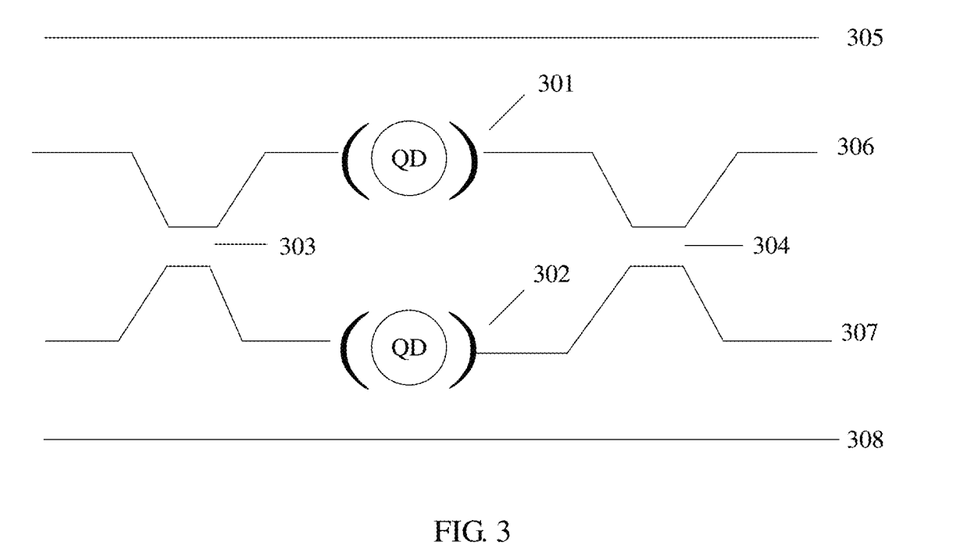
FIG. 3 is a schematic diagram of a quantum logic gate apparatus according to an embodiment of the present disclosure.

FIG. 3 is a schematic diagram of a quantum logic gate apparatus according to an embodiment of the present disclosure. The quantum logic gate apparatus in FIG. 3 includes two first phase shifters 301 and 302, a first optical splitter 303, and a second optical splitter 304. The first phase shifters 301 and 302 are connected between the first optical splitter 303 and the second optical splitter 304 using a waveguide. In FIG. 3, a part other than the first phase shifters 301 and 302, the first optical splitter 303, and the second optical splitter 304 may be a waveguide. For example, 305, 306, 307, and 308 in the FIG. all are waveguides.

A transition frequency of a quantum point in the first phase shifters 301 and 302 may be set such that transition energy differences for transition of coupled systems in the first phase shifters 301 and 302 from a ground state to a second-order dressed state are the same as energy of two photons that are input into the corresponding coupled systems. In this case, the quantum logic gate apparatus is a controlled-Z gate apparatus.

Reflectivities of the first optical splitter and the second optical splitter shown in FIG. 3 are both ½. In this case, a quantum logic gate in FIG. 3 can implement controlled-symbol reversal of a qubit transmitted in a waveguide.

One single photon is input into the waveguide 305 and the waveguide 306. Photon transmission in the waveguide 305 is defined as a $|0\rangle$ state of a qubit qb1, that is, $|0\rangle_{qb1}$. Photon transmission in the waveguide 306 is defined as $|1\rangle_{qb1}$. Similarly, one single photon is input into the waveguide 307 and the waveguide 308. Photon transmission in the waveguide 307 is defined as a $|1\rangle$ state of a qubit qb2, that is, $|1\rangle_{qb2}$. Photon transmission in the waveguide 308 is defined as $|0\rangle_{qb2}$.

When a quantum state of the qb1 is $|1\rangle_{qb1}$, that is, when the photon is input through 306, an input quantum state of the qb2 is $|\Psi\rangle_{qb2} = c_{0.qb2}|0\rangle_{qb2} + c_{1.qb2}|1\rangle_{qb2}$, and an output quantum state is $|\Psi\rangle_{qb2} = c_{0.qb2}|0\rangle_{qb2} - c_{1.qb2}|1\rangle_{qb2}$ after the photon passes through the controlled-Z gate. When a quantum state of the qb1 is $|0\rangle_{qb1}$, that is, when the photon is input through 305, an input quantum state of the qb2 is $|\Omega\rangle_{qb2} = c_{0.qb2}|0\rangle_{qb2} + c_{1.qb2}|1\rangle_{qb2}$, and an output quantum state is still $|\Psi\rangle_{qb2} = c_{0.qb2}|0\rangle_{qb2} + c_{1.qb2}|1\rangle_{qb2}$ after the photon passes through the controlled-Z gate.

Figure 4:
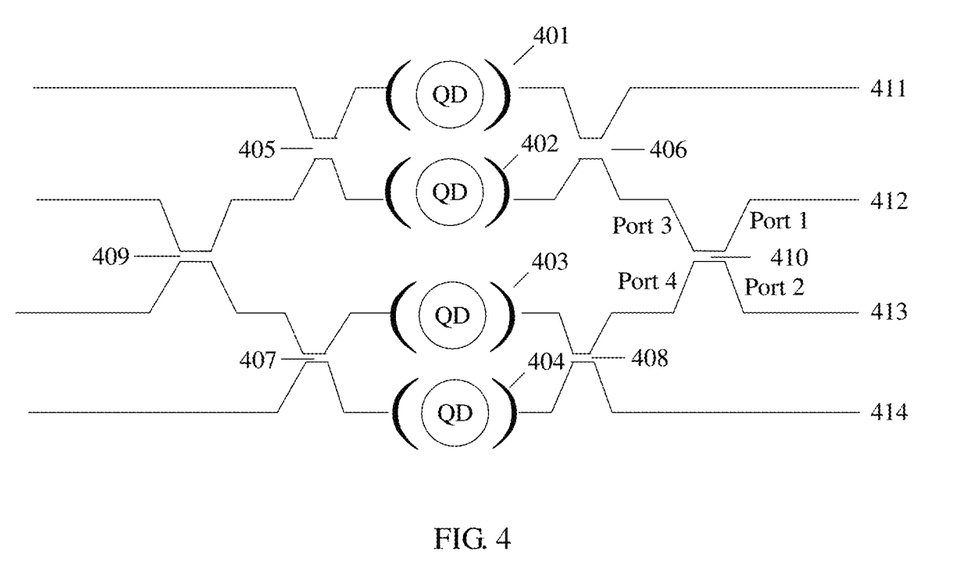
FIG. 4 is a schematic diagram of a quantum logic gate apparatus according to another embodiment of the present disclosure.

FIG. 4 is a schematic diagram of a quantum logic gate apparatus according to another embodiment of the present disclosure. The quantum logic gate apparatus in FIG. 4 includes two first phase shifters 401 and 402, two second phase shifters 403 and 404, a first optical splitter 405, a second optical splitter 406, a third optical splitter 407, a fourth optical splitter 408, a fifth optical splitter 409, and a sixth optical splitter 410. The two second phase shifters 403 and 404 are connected between the third optical splitter 407 and the fourth optical splitter 408 using a waveguide. Two first output ends of the fifth optical splitter 409 are respectively connected to a first input end of the first optical splitter 405 and a second input end of the third optical splitter 407 using waveguides. Two third input ends of the sixth optical splitter 410 are respectively connected to a second output end of the second optical splitter 406 and a third output end of the fourth optical splitter 408 using waveguides.

In FIG. 4, a part other than the phase shifters and the optical splitters may be a waveguide. For example, 411, 412, 413, and 414 in the FIG. all are waveguides.

The following briefly describes the optical splitter used in this embodiment of the present disclosure. The optical splitter 410 is used as an example for description. Four ports of the optical splitter 410, that is, a port 1, a port 2, a port 3, and a port 4, are marked in FIG. 4. It is assumed that a reflectivity of the optical splitter is η, and 0<=η<=1. When a classical light field whose strength is I is input through the input port 1 of the optical splitter, light strengths at the output port 3 and the port 4 are ηI and (1−η)I, respectively. If one single photon is input through the port 1, photon output probabilities of the output ports 3 and 4 are η and 1−η, respectively. Particularly, if η=½, and two single photons are input through the ports 1 and 2, the output ports 3 and 4 each have a ½ probability of outputting a pair of photons or outputting no photon.

In FIG. 4, reflectivities of the first optical splitter 405, the second optical splitter 406, the third optical splitter 407, and the fourth optical splitter 408 may all be ½, and reflectivities of the fifth optical splitter 409 and the sixth optical splitter 410 may both be 0.

Transition frequencies of quantum points in the two second phase shifters 403 and 404 may be set such that a transition energy difference for transition of a coupled system in the second phase shifter from a ground state to a second-order dressed state is the same as energy of two photons that are input into the coupled system. A transition frequency of a quantum point in the two first phase shifters 401 and 402 may be set such that a transition energy difference of a coupled system is different from energy of at least one photon that is input into the coupled system. In this case, the quantum logic gate apparatus is a controlled-Z gate apparatus.

The controlled-Z gate apparatus can implement reversal of qubits transmitted in different waveguides. For example, it is assumed that one single photon is input into the waveguide 411 and the waveguide 412. Photon transmission in the waveguide 411 is defined as a $|0\rangle$ state of a qubit qb1, that is, $|0\rangle_{qb1}$. Photon transmission in the waveguide 412 is defined as $|1\rangle_{qb1}$. Similarly, one single photon is input into the waveguide 413 and the waveguide 414. Photon transmission in the waveguide 413 is defined as a $|0\rangle$ state of a qubit qb2, that is, $|0\rangle_{qb2}$. Photon transmission in the waveguide 414 is defined as $|1\rangle_{qb2}$.

When a quantum state of the qb1 is $|1\rangle_{qb1}$, that is, when the photon is input through 412, an input quantum state of the qb2 is $|\Psi\rangle_{qb2} = c_{0.qb2}|0\rangle_{qb2} + c_{1.qb2}|1\rangle_{qb2}$, and an output quantum state is $|\Psi\rangle_{qb2} = c_{0.qb2}|0\rangle_{qb2} - c_{1.qb2}|1\rangle_{qb2}$ after the photon passes through the controlled-Z gate. When a quantum state of the qb1 is $|0\rangle_{qb1}$, that is, when the photon is input through 411, an input quantum state of the qb2 is $|\Psi\rangle_{qb2} = c_{0.qb2} + c_{1.qb2}|1\rangle_{qb2}$, and an output quantum state is still $|\Psi\rangle_{qb2} = c_{0.qb2}|0\rangle_{qb2} + c_{1.qb2}|1\rangle_{qb2}$ after the photon passes through the controlled-Z gate.

Transition frequencies of quantum points in the two first phase shifters 401 and 402 and the two second phase shifters 403 and 404 are both set such that a transition energy difference for transition of a coupled system in a corresponding phase shifter from a ground state to a first-order dressed state is the same as energy of one photon that is input into the coupled system. In this case, the quantum logic gate apparatus is a SWAP gate apparatus. The SWAP gate apparatus can implement swapping of two qubits.

One single photon is input into the waveguide 411 and the waveguide 412. Photon transmission in the waveguide 411 is defined as a $|0\rangle$ state of a qubit qb1, that is, $|0\rangle_{qb1}$, Photon transmission in the waveguide 412 is defined as $|1\rangle_{qb1}$. Similarly, one single photon is input into the waveguide 413 and the waveguide 414. Photon transmission in the waveguide 413 is defined as a $|0\rangle$ state of a qubit qb2, that is, $|0\rangle_{qb2}$. Photon transmission in the waveguide 414 is defined as $|1\rangle_{qb2}$.

A quantum state of the qubit qb1 is $|\Psi\rangle_{qb1}=c_{0,qb1}|0\rangle_{qb1}+c_{1,qb1}|1\rangle_{qb1}$, and a quantum state of the qubit qb2 is $|\Psi\rangle_{qb2}=c_{0,qb2}|0\rangle_{qb2}+c_{1,qb2}|1\rangle_{qb2}$. After the photon passes through a SWAP gate, output states are $|\Psi\rangle_{qb1}=c_{0,qb2}|0\rangle_{qb1}+c_{1,qb2}|1\rangle_{qb1}$ and $|\Psi\rangle_{qb2}=c_{0,qb1}|0\rangle_{qb2}+c_{1,qb1}|1\rangle_{qb2}$, respectively. That is, the SWAP gate apparatus in FIG. 4 in this embodiment of the present disclosure can implement swapping of two qubits.

The quantum logic gate apparatus in this embodiment of the present disclosure may further be used to constitute an optical quantum computing apparatus. The optical quantum computing apparatus may include at least one quantum logic gate apparatus, and the optical quantum computing apparatus may further include a waveguide, an optical splitter, a measurement apparatus, and the like.

Figure 5:
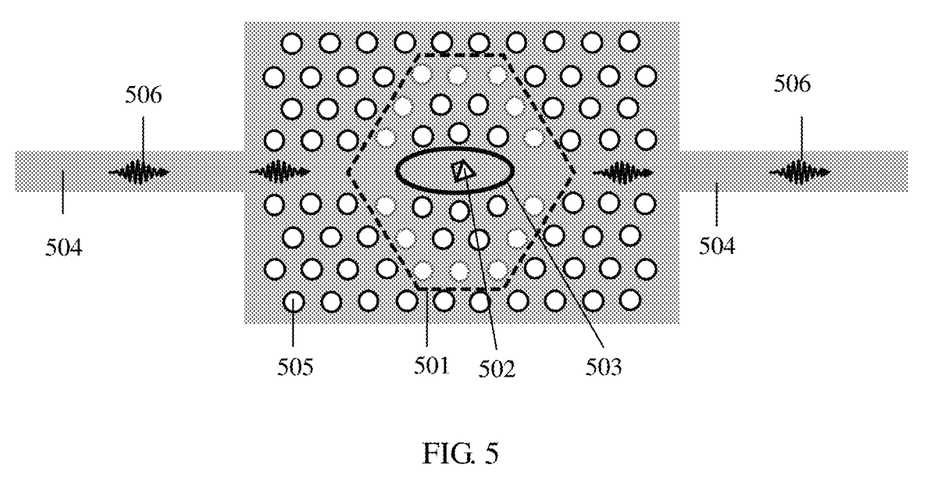
FIG. 5 is a specific schematic structural diagram of a phase shifter in a quantum logic gate according to an embodiment of the present disclosure.

FIG. 5 is a specific schematic structural diagram of a phase shifter in a quantum logic gate according to an embodiment of the present disclosure. The phase shifter in FIG. 5 includes an optical resonant cavity 501, a quantum point 502, and a metal resistive heater 503. All constituent parts are connected to each other using a waveguide 504. There is interaction between the optical resonant cavity and the quantum point. Photon or energy exchange may occur between the optical resonant cavity and the quantum point. That is, the quantum point and the optical resonant cavity are coupled to form a coupled system. In FIG. 5, a dashed-line box represents the optical resonant cavity 501, an ellipse represents the metal resistive heater 503, and a pattern constituted by two triangles represents the quantum point 502.

A grey part in the phase shifter in FIG. 5 is a medium material. Strip-shaped medium materials on the left side and the right side constitute waveguides 504, and may be configured to input and output a photon 506. A part, of a middle medium material, connected to the waveguides 504 on the two sides may also be a waveguide and may be configured to input and output a photon.

Optionally, the waveguide in this embodiment of the present disclosure may be a photon crystal waveguide. Correspondingly, the optical resonant cavity may be a photon crystal micro-cavity. In an embodiment of the present disclosure, the photon crystal waveguide may be coupled to the photon crystal micro-cavity in a direct coupling manner or nearest-neighbor coupling manner. When the photon crystal waveguide and the photon crystal micro-cavity are directly coupled, the photon crystal waveguide may be located in the optical resonant cavity.

White round patterns on the middle medium material are air holes. Periodically arranged air holes and the medium material constitute a photon crystal structure. A location of an air hole in a dashed-line hexagon is deviated relative to a location of an air hole in a standard photon crystal structure. In addition, air holes at different locations may be deviated by different deviation distances such that an optical resonant cavity structure can be formed in the dashed-line box. For example, when a middle part is a photon crystal waveguide, a photon crystal micro-cavity structure can be formed.

In an embodiment of the present disclosure, an energy level structure of an optical resonant cavity that includes no quantum point has an equal spacing, and the spacing is limited within energy of a single photon in the optical resonant cavity. Such an energy level structure of an optical resonant cavity is referred to as a simple harmonic energy level structure. The quantum point and the optical resonant cavity are coupled to form a coupled system. An energy level structure of the coupled system does not have an equal spacing. Such an energy level structure is an anharmonic energy level structure (anharmonic energy structure). In this embodiment of the present disclosure, different dressed states in the anharmonic energy level structure of the coupled system have different energy or frequencies, and spacings between energy or frequencies of all dressed states are not equal. Therefore, a transition frequency of the quantum point may be changed such that a transition energy level difference of the coupled system is the same as energy of one photon or two photons input into the coupled system, thereby correspondingly implementing phase change in a single-photon state or a dual-photon state.

The phase shifter in this embodiment of the present disclosure may further include an adjuster configured to adjust the transition frequency of the quantum point. For example, the on-chip integrated metal resistive heater in FIG. 5 may control quantum point temperature to change the transition frequency of the quantum point, and further enable, by changing the transition frequency of the quantum point, the coupled system to work in a single-photon phase shift work state, a dual-photon phase shift work state, or a phase shift-free work state.

In an embodiment of the present disclosure, a resonance frequency of the optical resonant cavity may be determined by a material of the optical resonant cavity and a structure of the optical resonant cavity. The structure of the optical resonant cavity may include an air-hole location, size, or the like.

Figure 6:
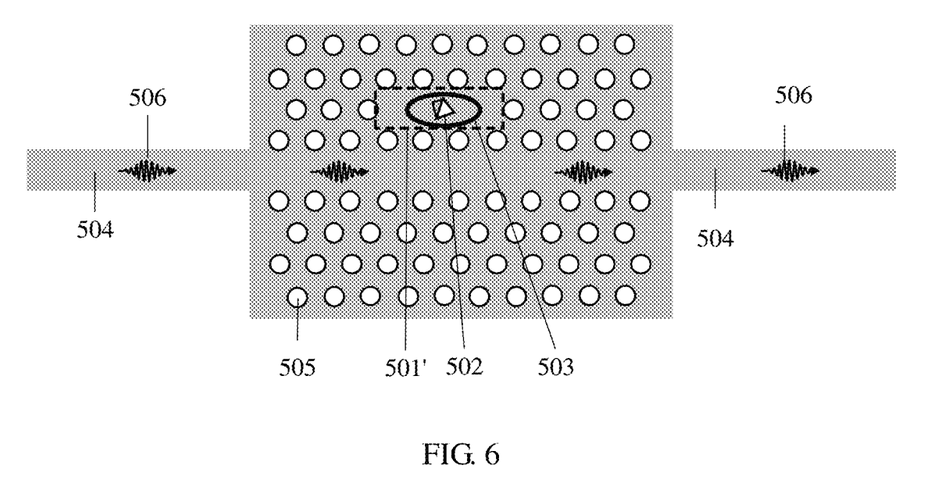
FIG. 6 is a specific schematic structural diagram of a phase shifter in a quantum logic gate according to another embodiment of the present disclosure.

FIG. 6 is a specific schematic structural diagram of a phase shifter in a quantum logic gate according to another embodiment of the present disclosure. The phase shifter in FIG. 6 includes an optical resonant cavity 501', a quantum point 502, and a metal resistive heater 503. All constituent parts are connected to each other using a waveguide 504. There is interaction between the optical resonant cavity and the quantum point. Photon or energy exchange may occur between the optical resonant cavity and the quantum point. That is, it is considered that the optical resonant cavity and the quantum point are coupled to form a coupled system. In FIG. 6, a dashed-line box represents the optical resonant cavity 501', an ellipse represents the metal resistive heater 503, a pattern constituted by two triangles represents the quantum point 502, a small round pattern represents an air hole 505, and 506 is a photon that is input into the coupled system.

A difference between a structure of the phase shifter in FIG. 6 and a structure of the phase shifter in FIG. 5 is that a structure of the optical resonant cavity 501' in FIG. 6 is different from a structure of the optical resonant cavity 501 in FIG. 5. For other structures and functions in the phase shifter, refer to descriptions of the phase shifter in FIG. 5. To avoid repetition, details are not described herein again. The following describes a formation manner of the optical resonant cavity 501' in an embodiment of the present disclosure In the dashed-line box shown in FIG. 6, three periodically arranged air holes in a row in a photon crystal structure are filled with medium materials, that is, locations of the three air holes in the row are filled with medium materials, and no air hole is distributed at the locations. In this way, the optical resonant cavity 501' is formed in the dashed-line box.

In an embodiment of the present disclosure, an optical quantum computing apparatus may be constituted using at least one quantum logic gate apparatus with a waveguide, an optical splitter, a measurement apparatus, and the like, and is used for optical quantum computing.

The foregoing describes in detail structures for the phase shifter and the quantum logic gate apparatus according to the embodiments of the present disclosure with reference to FIG. 1 to FIG. 6. The following describes in detail a phase shift method according to an embodiment of the present disclosure with reference to FIG. 7.

Figure 7:
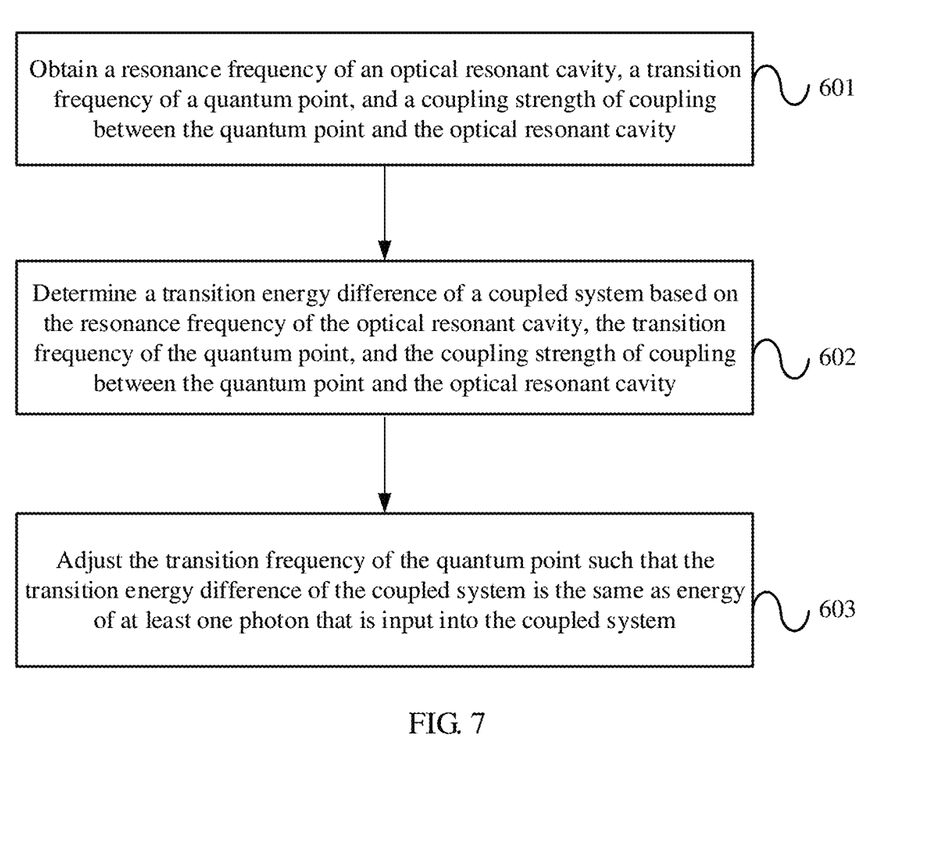
FIG. 7 is a schematic flowchart of a phase shift method according to an embodiment of the present disclosure.

FIG. 7 is a schematic flowchart of the phase shift method according to this embodiment of the present disclosure. The method in FIG. 7 may be applied to the coupled system in FIG. 1 to FIG. 6, and is performed by a controller in the coupled system. The coupled system is formed by coupling an optical resonant cavity and a quantum point. The quantum point is located in the optical resonant cavity. A process of the phase shift method in FIG. 7 is as follows.

Step 601: Obtain a resonance frequency of the optical resonant cavity, a transition frequency of the quantum point, and a coupling strength of coupling between the quantum point and the optical resonant cavity.

Step 602: Determine a transition energy difference of the coupled system based on the resonance frequency of the optical resonant cavity, the transition frequency of the quantum point, and the coupling strength of coupling between the quantum point and the optical resonant cavity.

Step 603: Adjust the transition frequency of the quantum point such that the transition energy difference of the coupled system is the same as energy of at least one photon that is input into the coupled system.

According to the phase shift method in this embodiment of the present disclosure, the optical resonant cavity and the quantum point are coupled to form the coupled system and obtain the transition energy difference between different energy levels of the coupled system, the transition frequency of the quantum point is adjusted, and the photon is input into the coupled system such that the transition energy difference of the coupled system is the same as the energy of the at least one photon that is input into the coupled system. In this way, a quantum state phase of the coupled system can be changed to implement phase inversion.

The phase shift method according to this embodiment of the present disclosure may be corresponding to the phase shifter in FIG. 1 to FIG. 6 in the embodiments of the present disclosure. In addition, each step process of the method may be implemented by a corresponding component in the phase shifter, the quantum logic gate apparatus, and the optical quantum computing apparatus. For brevity, details are not described herein again.

Optionally, in an embodiment of the present disclosure, the adjusting $\omega_x$ such that the transition energy difference of the coupled system is the same as energy of at least one photon that is input into the coupled system includes adjusting $\omega_x$ such that an energy difference for transition of the coupled system from a ground state to a first-order dressed state is the same as energy of one photon that is input into the coupled system.

Optionally, in an embodiment of the present disclosure, the adjusting $\omega_x$ such that the transition energy difference of the coupled system is the same as energy of at least one photon that is input into the coupled system includes adjusting $\omega_x$ such that an energy difference for transition of the coupled system from a ground state to a second-order dressed state is the same as energy of two photons that are input into the coupled system.

Optionally, in an embodiment of the present disclosure, a transition energy level of the coupled system includes two first-order dressed states $|1-\rangle$ and $|1+\rangle$, and frequencies of $|1-\rangle$ and $|1+\rangle$ are respectively $$\omega_c + \frac{1}{2}\Delta - \frac{1}{2}\sqrt{\Delta^2 + 4g^2} \text{ and}$$

$$\omega_c + \frac{1}{2}\Delta + \frac{1}{2}\sqrt{\Delta^2 + 4g^2},$$

where $\Delta=\omega_x-\omega_c$, and the transition energy difference of the coupled system is determined by the frequency of $|1-\rangle$ or $|1+\rangle$.

Optionally, in an embodiment of the present disclosure, a transition energy level of the coupled system includes two second-order dressed states $|2-\rangle$ and $|2+\rangle$, and frequencies of $|2-\rangle$ and $|2+\rangle$ are respectively $$2\omega_c + \frac{1}{2}\Delta - \frac{1}{2}\sqrt{\Delta^2 + 8g^2} \text{ and}$$

$$2\omega_c + \frac{1}{2}\Delta + \frac{1}{2}\sqrt{\Delta^2 + 8g^2},$$

where $\Delta=\omega_x-\omega_c$, and the transition energy difference of the coupled system is determined by the frequency of $|2-\rangle$ or $|2+\rangle$.

It should be understood that "one embodiment" or "an embodiment" mentioned in the whole specification indicates that specific features, structures, or characteristics related to the embodiment are included in at least one embodiment of the present disclosure. Therefore, "in one embodiment" or "in an embodiment" appearing throughout the specification may not be a same embodiment. In addition, these specific features, structures, or characteristics may be combined in one or more embodiments in any proper manner.

It should be understood that, in the embodiments of the present disclosure, sequence numbers of the foregoing processes do not indicate a performing sequence. A performing sequence of the processes should be determined based on functions and internal logic of the processes, but should not constitute any limitation on implementation processes of the embodiments of the present disclosure.

It should be understood that, in the embodiments of the present disclosure, "B corresponding to A" indicates that B is associated with A, and B may be determined based on A. However, it should further be understood that determining B based on A does not mean that B is determined based on only A, that is, B may also be determined based on A and/or other information.

It should be understood that the term "and/or" in this specification is merely an associative relationship for describing associated objects, and indicates that three relationships may exist. For example, A and/or B may indicate the following three cases A alone exists, both A and B exist, and B alone exists. In addition, the character "/" in this specification usually indicates that there is an "or" relationship between former and latter associated objects.

A person of ordinary skill in the art may be aware that units and algorithm steps in examples described with reference to the embodiments disclosed in this specification can be implemented by electronic hardware or a combination of computer software and electronic hardware. Whether the functions are performed by hardware or software depends on specific applications and design constraint conditions of the technical solutions. A person skilled in the art may use different methods to implement the described functions for each specific application, but it should not be considered that such an implementation goes beyond the scope of the present disclosure.

A person of ordinary skill in the art may understand that all or a part of the steps in the foregoing method implementations may be implemented by a program instructing relevant hardware. The program may be stored in a computer readable storage medium. When the program runs, the foregoing content of each implementation of a communications method based on an MIP technology in the present disclosure may be included. The storage medium herein is, for example, a read-only memory (ROM)/random access memory (RAM), a magnetic disk, or an optical disc.

When the functions are implemented in a form of a software function unit, and are sold or used as an independent product, the functions may be stored in a computer readable storage medium. Based on such an understanding, the technical solutions of the present disclosure essentially, or the part contributing to the other approaches, or some of the technical solutions may be implemented in a form of a software product. The computer software product is stored in a storage medium, and includes several instructions for instructing a computer device (which may be a personal computer, a server, a network device, or the like) to perform all or a part of the steps of the methods described in the embodiments of the present disclosure. The foregoing storage medium includes various media that can store program code, such as a universal serial bus (USB) flash drive, a removable hard disk, a ROM, a RAM, a magnetic disk, and an optical disc.

The foregoing descriptions are merely specific implementations of the present disclosure, but are not intended to limit the protection scope of the present disclosure. Any variation or replacement readily figured out by a person skilled in the art within the technical scope disclosed in the present disclosure shall fall within the protection scope of the present disclosure. Therefore, the protection scope of the present disclosure shall be subject to the protection scope of the claims.

What is claimed is:

1. A phase shifter, comprising:
    an optical resonant cavity, a resonance frequency of the optical resonant cavity being $\omega_c$; and
    a quantum point located in the optical resonant cavity, a transition frequency of the quantum point being $\omega_x$, the quantum point and the optical resonant cavity being coupled to form a coupled system, a transition energy difference of the coupled system being determined by the $\omega_c$, the $\omega_x$, and a coupling strength between the quantum point and the optical resonant cavity (g), and the $\omega_x$ being set to enable the transition energy difference of the coupled system to be same as energy of at least one photon input into the coupled system.

2. The phase shifter of claim 1, further comprising an adjustment apparatus coupled to the optical resonant cavity and configured to adjust the $\omega_x$.

3. The phase shifter of claim 2, wherein the adjustment apparatus is a heater, and the heater being configured to adjust the $\omega_x$ by changing temperature of the quantum point.

4. The phase shifter of 1, wherein the $\omega_x$ is set to enable a transition energy difference for transition of the coupled system from a ground state to a first-order dressed state to be same as energy of one photon input into the coupled system.

5. The phase shifter of claim 1, wherein the $\omega_x$ is set to enable a transition energy difference for transition of the coupled system from a ground state to a second-order dressed state to be same as energy of two photons input into the coupled system.

6. The phase shifter of claim 1, wherein a transition energy level of the coupled system comprises two first-order dressed states $|1-\rangle$ and $|1+\rangle$, frequencies of the $|1-\rangle$ and the $|1+\rangle$ being respectively $$\omega_c + \frac{1}{2}\Delta - \frac{1}{2}\sqrt{\Delta^2 + 4g^2} \text{ and } \omega_c + \frac{1}{2}\Delta + \frac{1}{2}\sqrt{\Delta^2 + 4g^2},$$

the $\Delta = \omega_x - \omega_c$, and transition energy difference of the coupled system being determined by a frequency of the $|1-\rangle$ or a frequency of the $|1+\rangle$.

7. The phase shifter of claim 1, wherein a transition energy level of the coupled system comprises two second-order dressed states $|2-\rangle$ and $|2+\rangle$, frequency of the $|2-\rangle$ and the $|2+\rangle$ being respectively $$2\omega_c + \frac{1}{2}\Delta - \frac{1}{2}\sqrt{\Delta^2 + 8g^2} \text{ and } 2\omega_c + \frac{1}{2}\Delta + \frac{1}{2}\sqrt{\Delta^2 + 8g^2},$$

the $\Delta = \omega_x - \omega_c$, and the transition energy difference of the coupled system being determined by a frequency of the $|2-\rangle$ or a frequency of the $|2+\rangle$.

8. A quantum logic gate apparatus, comprising:
    a first optical splitter;
    a second optical splitter; and
    two first phase shifters coupled between the first optical splitter and the second optical splitter using a waveguide, and each first phase shifter comprising:
        an optical resonant cavity, a resonance frequency of the optical resonant cavity being $\omega_c$; and
        a quantum point located in the optical resonant cavity, a transition frequency of the quantum point being $\omega_x$, the quantum point and the optical resonant cavity being coupled to form a coupled system, a transition energy difference of the coupled system being determined by the $\omega_c$, the $\omega_x$, and a coupling strength between the quantum point and the optical resonant cavity (g), and the $\omega_x$ being set to enable the transition energy difference of the coupled system to be same as energy of at least one photon input into the coupled system.

9. The quantum logic gate apparatus of claim 8, wherein a transition frequency of a quantum point in a first phase shifter is set to enable a transition energy difference for transition of a coupled system in the first phase shifter from a ground state to a second-order dressed state to be same as energy of two photons input into the coupled system in the first phase shifter, and the quantum logic gate apparatus being a controlled-Z gate apparatus.

10. A quantum logic gate apparatus, comprising:
a first optical splitter;
a second optical splitter;
two first phase shifters coupled between the first optical splitter and the second optical splitter using a waveguide;
a third optical splitter;
a fourth optical splitter;
two second phase shifters coupled between the third optical splitter and the fourth optical splitter using another waveguide;
a fifth optical splitter, two output ends of the fifth optical splitter being respectively coupled to an input end of the first optical splitter and an input end of the third optical splitter using first waveguides; and
a sixth optical splitter, two input ends of the sixth optical splitter being respectively coupled to an output end of the second optical splitter and an output end of the fourth optical splitter using second waveguides, and
each one of the two first phase shifters and the two second phase shifters comprising:
an optical resonant cavity, a resonance frequency of the optical resonant cavity being $\omega_c$; and
a quantum point located in the optical resonant cavity, a transition frequency of the quantum point being $\omega_x$, the quantum point and the optical resonant cavity being coupled to form a coupled system, a transition energy difference of the coupled system being determined by the $\omega_c$, the $\omega_x$, and a coupling strength between the quantum point and the optical resonant cavity (g), and the $\omega_x$ being set to enable the transition energy difference of the coupled system to be same as energy of at least one photon input into the coupled system.

11. The quantum logic gate apparatus of claim 10, wherein a transition frequency of a quantum point a second phase shifter is set, to enable a transition energy difference for transition of a coupled system in the second phase shifter from a ground state to a second-order dressed state to be same as energy of two photons input into the coupled system in the phase shifter, a transition frequency of a quantum point in a first phase shifter is being set to enable a transition energy difference of a coupled system in the first phase shifter to be different from energy of at least one photon input into the coupled system in the first phase shifter, and the quantum logic gate apparatus being a controlled-Z gate apparatus.

12. The quantum logic gate apparatus of claim 10, wherein a transition frequency of a quantum point in a first phase shifter and a transition frequency of a quantum point in a second phase shifter are both set, to enable a transition energy difference for transition of a coupled system in a corresponding phase shifter from a ground state to a first-order dressed state to be same as energy of one photon input into the coupled system in the corresponding phase shifter, and the quantum logic gate apparatus being a swap gate apparatus.

13. An optical quantum computing apparatus, comprising at least one quantum logic gate apparatus, and the at least one quantum logic gate apparatus comprising:
a first optical splitter;
a second optical splitter; and
two first phase shifters coupled between the first optical splitter and the second optical splitter using a waveguide, and each first phase shifter comprising:
an optical resonant cavity, a resonance frequency of the optical resonant cavity being $\omega_c$; and
a quantum point located in the optical resonant cavity, a transition frequency of the quantum point being $\omega_x$, the quantum point and the optical resonant cavity being coupled to form a coupled system, a transition energy difference of the coupled system being determined by the $\omega_c$, the $\omega_x$, and a coupling strength between the quantum point and the optical resonant cavity (g), and the $\omega_x$ being set to enable the transition energy difference of the coupled system to be same as energy of at least one photon input into the coupled system.

14. A phase shift method, applied to a coupled system formed by coupling an optical resonant cavity and a quantum point located in the optical resonant cavity, and the method comprising:
obtaining a resonance frequency of the optical resonant cavity ($\omega_c$), a transition frequency of the quantum point ($\omega_x$), and a coupling strength of coupling between the quantum point and the optical resonant cavity (g);
determining a transition energy difference of the coupled system based on the $\omega_c$, the $\omega_x$, and the g; and
adjusting the $\omega_x$ to enable the transition energy difference of the coupled system to be same as energy of at least one photon input into the coupled system.

15. The method of claim 14, wherein adjusting the $\omega_x$ to enable the transition energy difference of the coupled system to be same as the energy of the at least one photon input into the coupled system comprises adjusting the $\omega_x$ that to enable an energy difference for transition of the coupled system from a ground state to a first-order dressed state to be same as energy of one photon input into the coupled system.

16. The method of claim 14, wherein adjusting the $\omega_x$ to enable the transition energy difference of the coupled system to be same as the energy of the at least one photon input into the coupled system comprises adjusting the $\omega_x$ to enable an energy difference for transition of the coupled system from a ground state to a second-order dressed state to be same as energy of two photons input into the coupled system.

17. The method of claim 14, wherein a transition energy level of the coupled system comprises two first-order dressed states $|1-\rangle$ and $|1+\rangle$, frequencies of the $|1-\rangle$ and the $|1+\rangle$ being respectively $$\omega_c + \frac{1}{2}\Delta - \frac{1}{2}\sqrt{\Delta^2 + 4g^2} \text{ and } \omega_c + \frac{1}{2}\Delta + \frac{1}{2}\sqrt{\Delta^2 + 4g^2},$$

$\Delta = \omega_x - \omega_c$, and the transition energy difference of the coupled system being determined by a frequency of the $|1-\rangle$.

18. The method of claim 14, wherein a transition energy level of the coupled system comprises two second-order dressed states $|2-\rangle$ and $|2+\rangle$, frequencies of the $|2-\rangle$ and the $|2+\rangle$ being respectively $$2\omega_c + \frac{1}{2}\Delta - \frac{1}{2}\sqrt{\Delta^2 + 8g^2} \text{ and } 2\omega_c + \frac{1}{2}\Delta + \frac{1}{2}\sqrt{\Delta^2 + 8g^2},$$

the $\Delta = \omega_x - \omega_c$, and the transition energy difference of the coupled system being determined by a frequency of the $|2-\rangle$.

19. The method of claim 14, wherein a transition energy level of the coupled system comprises two first-order dressed states $|1-\rangle$ and $|1+\rangle$, frequencies of the $|1-\rangle$ and the $|1+\rangle$ being respectively $$\omega_c + \frac{1}{2}\Delta - \frac{1}{2}\sqrt{\Delta^2 + 4g^2} \text{ and } \omega_c + \frac{1}{2}\Delta + \frac{1}{2}\sqrt{\Delta^2 + 4g^2},$$

the $\Delta = \omega_x - \omega_c$, and the transition energy difference of the coupled system being determined by a frequency of the $|1+\rangle$.

20. The method of claim 14, wherein a transition energy level of the coupled system comprises two second-order dressed states $|2-\rangle$ and $|2+\rangle$ frequencies of the $|2-\rangle$ and the $|2+\rangle$ being respectively $$2\omega_c + \frac{1}{2}\Delta - \frac{1}{2}\sqrt{\Delta^2 + 8g^2} \text{ and } 2\omega_c + \frac{1}{2}\Delta + \frac{1}{2}\sqrt{\Delta^2 + 8g^2},$$

the $\Delta = \omega_x - \omega_c$, and the transition energy difference of the coupled system being determined by a frequency of the $|2+\rangle$.

* * * * *

UNITED STATES PATENT AND TRADEMARK OFFICE
CERTIFICATE OF CORRECTION

PATENT NO.         : 10,860,944 B2
APPLICATION NO.    : 16/234083
DATED              : December 8, 2020
INVENTOR(S)        : Wen Zhang and Chen-Xiong Zhang Page 1 of 1

It is certified that error appears in the above-identified patent and that said Letters Patent is hereby corrected as shown below:

In the Claims

Claim 6, Column 18, Line 29: "D=w$_x$-wc" should read "$\Delta = \omega_x - \omega_c$"

Claim 7, Column 18, Line 35: "frequency of" should read "frequencies of"

Claim 11, Column 19, Line 45: "in the phase shifter" should read "in the second phase shifter"

Claim 12, Column 19, Line 54: "both set, to enable" should read "both set to enable"

Signed and Sealed this
Nineteenth Day of January, 2021

Andrei Iancu
*Director of the United States Patent and Trademark Office*